Dec. 29, 1964 H. L. SHORTT ETAL 3,163,588

METHOD OF INTERCONNECTING PATHWAY PATTERNS
OF PRINTED CIRCUIT PRODUCTS
Filed Feb. 14, 1955

INVENTORS
HUBERT L. SHORTT
JOHN B. LANGTON
BY

ATTORNEY

United States Patent Office 3,163,588
Patented Dec. 29, 1964

3,163,588

METHOD OF INTERCONNECTING PATHWAY PATTERNS OF PRINTED CIRCUIT PRODUCTS

Hubert L. Shortt and John B. Langton, Tarrytown, N.Y., assignors to Technograph Printed Electronics, Inc., Tarrytown, N.Y.

Filed Feb. 14, 1955, Ser. No. 487,916
12 Claims. (Cl. 204—16)

The present invention relates to printed circuit products of the kind involving a conductive pathway pattern adhered to opposite sides of insulation backing, and more particularly to metallic junctions between the two pathway pattern for electrically interconnecting the same and to a method of making such junctions.

For the purpose of the invention the conductive pathway patterns may be produced by any of the techniques known in this field, for instance, by the etched foil method. Each of the pathway patterns may either represent a complete circuit system or component, or the two patterns may complement each other to form the complete circuit system or component. Pathway patterns on both sides of the backing are generally used when the circuit system formed by the patterns involves crossing connections.

The interconnections of the pathway patterns on the two sides of the insulation material are customarily effected through one or several holes through the insulation backing. The thickness of the backing may and does vary within wide limits. In actual practice, it varies between paper thin insulation sheets and solid blocks of insulation material whereas the conductive pattern is always thin, usually in the order of foil thickness, even when reinforced by the deposition of metal. The use of a thin conductive pattern is one of the inherent characteristics of printed circuit products produced by any of the techniques now known.

Irrespectively of the thickness of the insulation backing, the making of electrically satisfactory and mechanically reliable interconnections of the pathway patterns on the two sides of the backing presents considerable difficulties in practice. The quality of the connections, both as to the electrical and the mechanical properties, is of particular importance for printed circuit products. Such products are frequently used in electronic equipment which demands low contact resistance and high constancy of the characteristics of the connections and which is frequently used under conditions where it is exposed to vibrations or impact so that adequate mechanical strength of the connections is also essential. Furthermore, printed circuit products are mass production items so that it is essential that the connections through the backing can be produced in an economical, rapid and uniform manner.

Prefabricated eyelets are hollow rivets are widely used at the present time to interconnect the two pathway patterns. The insertion of eyelets or rivets in the holes through the backing is laborious as these holes are usually quite small and the eyelets or rivets must be upset one at a time. Furthermore, while the connections effected by the eyelets or rivets are generally adequate as to the mechanical properties solder must be added to produce satisfactory electrical connections between the two pathway patterns. As a result, labor costs are very high and the uniformity and constancy of connections by eyelets or rivets are far from ideal, the more so as the tightness of the engagement between the eyelets or rivets and the pathway patterns tends to deteriorate due to shrinkage of the insulation material.

Accordingly, one of the objects of the present invention is to provide a novel and improved method of making metallic junctions between the two pathway patterns which constitute high quality connections as to both, the electrical and the mechanical properties.

Another object of the invention is to provide a novel and improved method of producing metallic junctions which are highly uniform and homogeneous.

Still another object of the invention is to provide a more economical and simplified method of making the aforesaid metallic junctions which completely eliminates the necessity of applying solder in order to obtain a homogeneous metal bond from the pathway pattern on one side of the insulation to the pathway pattern on the opposite side thereof.

A further object of the invention is to provide a novel and improved method of making the aforesaid metallic joints by which all the required connections between the two pathway patterns can be simultaneously produced.

A still further object of the invention is to provide a novel and improved method of making the aforesaid metallic junctions, the steps of which are so integrated in steps used for developing the pathway patterns that upon completion of said steps the metallic junctions are also completed thereby permitting the manufacture of printed circuit products with interconnected pathway patterns in a continuous operating suitable for mass production methods.

Yet another object of the invention is a novel and improved homogeneous metallic joint between the two pathway patterns on opposite sides of the insulation backing. The metal of this joint is integral for all practical purposes with the metal of the pathway patterns and flush with the outer surface of said pathway patterns. As a result, the connection formed by the joint according to the invention has no appreciable ohmic resistance, is mechanically strong and does not impede the coaction of a sliding contact with either one of the pathway patterns. Furthermore, the homogenity of the joint eliminates the possibility of corrosion and the effect of electrolysis which are inherent in most mechanical joints as heretofore known.

Other and further objects, features and advantages of the invention will be pointed out hereinafter and set forth in the appended claims forming part of the invention.

In the accompanying drawing the steps involved in the method of the invention and a finished metallic joint according to the invention are shown by way of example and not by way of limitation.

Figure 2:
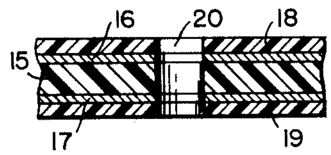
FIG. 2 is a section taken on line 2—2 of FIG. 1 on an enlarged scale.
Figure 3:
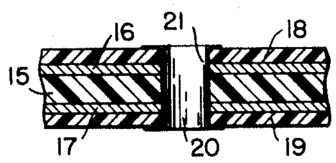
FIGS. 3, 4 and 5 are sections similar to FIG. 2 showing successive steps used in making a metallic joint according to the invention.

The base or stock material for making printed circuit products of the type here involved is a laminate of insulation material 15 with metal foils generally copper foils 16 and 17 adhered to both sides of the insulation material. Various types of insulation material are suitable for the purpose such as a phenolic material commonly known under the trademark Bakelite. The copper foil which may have a thickness of .00135" is bonded to the insulation material by any adhesive and any method suitable for the purpose. The metal clad insulation material as described is commercially available and its specific features and the method of producing the same are not essential for the understanding of the invention.

The first step of the invention is to cover foils 16 and 17 with electrically non-conductive protective coatings 18 and 19 respectively. The purpose of the coatings is to protect the metal of the foils from entering into unwanted chemical reactions with the reagents used in the subsequently described steps. Many types of commercially available plastics are suitable as coating materials. The vinyl class of plastic has been found to be particularly suitable. The protective coatings may be specifically applied for the purpose of the invention which will become more fully apparent from the subsequent description but in actual practice metal clad insulation material of the kind here used is freqeuntly supplied with a strippable plastic coating known as frisket to prevent oxidation of the copper foils by exposure to air and corrosion from finger marks during handling and shipping. An under-coating of latex may be provided. Such under-coating facilitates the stripping of the plastic coatings.

The next step is to produce the holes through which the metallic joints are to be made for interconnecting the pathway patterns to be developed from foils 16 and 17. The number and the location of the holes must be so selected that the holes will ultimately fall in their proper positions and that all the required metallic joints are made when the pathway patterns are completed.

The holes can be produced by any suitable means, the selection of which largely depends upon the number of circuit products to be produced and the number of holes involved. For a small run, the holes may be produced by drilling but for larger ones, it is more economical to employ a drill template or a die punch with which many thousands of circuit boards or other printed circuit products can be prepunched in a relatively short time. The presence of the coatings 18 and 19 protects the foil surfaces from damage during the hole-forming operation which is a mechanical process involving relatively rough handling of the laminates. To simplify the illustration and description a single hole 20 is shown in the sections.

The following step is the metal plating of the wall surfaces defining the holes, generally by electrodeposition. As is evident, the wall surfaces being formed by the insulation material of base 15 except for the exposed edges of foils 16 and 17 are non-conductive. Accordingly, the wall surfaces must be prepared for the plating operation by rendering the same electrically conductive to an extent sufficient to permit the plating operation. The wall surfaces may be rendered sufficiently conductive by the application of suitable conductive liquids. Various conductive liquids are available for this purpose such as metal pigment paints or inks. The paint or ink for instance, a substance containing silver, copper, graphite, or any suitable metallic powder may be applied to the wall surfaces by any suitable means. For a small run, a dauber or a spray gun may be used. The most practical mass production method of applying a liquid medium drying into an electrically conductive layer of film is a simple dipping operation. The dipping method can be conveniently used since coatings 18 and 19 prevent the formation of a conductive film on the foil surfaces. The result of the drying of the conductive liquid is an electrically conductive layer 21 completely coating the walls of the holes and usually also parts of the outside of the protective coatings, depending upon the operation used to apply the conductive liquid. As is apparent, the only direct contact between the conductive layer 21 and the foils 16 and 17 is along the cut edges of the latter within the holes. The demands on the conductivity and permanency of the conductive layer or coating 21 are moderate so that a resistive layer formed by a material such as graphite is generally sufficient.

The wall surfaces of the holes may also be rendered electrically conductive by chemical deposition of a metal film. Various methods of such chemical deposition suitable for the purpose are well known in the art. They generally involve a thorough cleaning of the surfaces to be covered with the metal film for instance, by means of a proprietary or commercially available cleanser containing sodium-hydroxide; adsorption of a metal salt onto the cleaned surfaces by immersing the material in a hot solution of salt; rinsing away the excess of the solution, leaving only adsorbed ions in the surfaces; and applying to the material a solution of a metal suitable for deposition in elemental form and adding thereto a reducing agent such as glucose, dextrose and/or formaldehyde. The metal solution may be applied by placing the material in the same or spraying the solution and the additive onto the ionized surface from separate spray nozzles. In the last step, pure metal is deposited out of the metal solution and a continuous metal film is formed by polar attraction on the surfaces in which the ions are present. In the parts of the solution more remote from the ionized surfaces the reduction reaction taking place results in the deposition of a sludge of the metal. Metal films such as copper or silver films on the wall surfaces of the holes may be conveniently and economically produced by the aforedescribed method.

Coatings 18 and 19 protect the copper foils 16 and 17 from contact with the solutions used during the chemical deposition of the metal film thereby preventing undesirable reactions which would occur by contact of the foils with the chemically active solutions.

The chemically deposited metal film may be employed instead of or in addition to layer 21. In the latter case, layer 21 serves as undercoating. The provision of such undercoating greatly facilitates the subsequent chemical deposition of the metal film.

Figure 4:
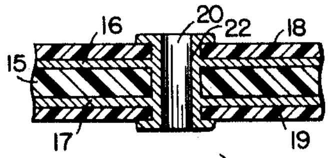

The metal clad laminate is now ready for the plating-through-holes operation, generally a copper plating operation. The plating is generally carried out by making the copper foils of the laminate interconnected by layers 21 the cathode in a copper solution which acts as an electrolyte. The principle of plating operations of this type is well understood in the art and a detailed description thereof is not essential for the understanding of the invention. It suffices to state that any plating operation requires that an adquate current flows through the conductive surface to be plated. In the structure here to be plated, the ohmic resistance of the foils is insignificant in comparison with that of the conductive layers or films coating the holes. Consequently, practically all the plating current would flow to the electrolyte through the foils if the same were exposed. As a result, the foil surfaces would be uniformly coated by the copper but practically none would be deposited on layers 21. However, due to the insulating coatings 18 and 19 still covering the foils during the plating operation, an adequate current flow is forced to flow through the conductive layers or films 21 which are in contact with the foils along the exposed edges of the latter. It has been found that a particularly good plating is obtained when at the beginning of the plating operation an excessive current is applied for a short period of time to produce a so-called flash coating upon layers 21 lining the holes. After such flash coating is formed, the initial copper coating of layers 21 is built up by continuing the plating operation with a normal plating current. The coating or sheath 22 thus formed is integral for all practical purposes with the foils along the exposed edges thereof and usually extends over at least part of the outside of coatings 18 and 19 due to splattering of conductive liquid but no copper is deposited on the foil surfaces proper. FIG. 4 shows the material after completion of the aforedescribed plating operation. The thickness of the copper plating within the hole formed by sheath 22 is selected in accordance with the electric currents which will be ultimately carried by the pathway patterns to be developed from foils 16 and 17 and should be sufficiently robust to withstand the stresses encountered during the subsequently described stripping operation.

It is further apparent from FIG. 4 that the sheath or joint constitutes in effect an electroformed rivet or eyelet which assures safe mechanical attachment of the terminal points of the circuitry developed from foils 16 and 17 to insulation material 15 and which further affords a convenient means for connecting external circuit components to the printed circuit product. The sheath or joint formed by the plating-through-hole constitutes, in addition to being an excellent electrical connection, a mechanical bond equivalent to the bond obtained by an eyelet or rivet of comparable dimensions. In other words, metallic joints according to the invention afford all the advantages of eyelets or rivets without the disadvantages thereof.

Figure 5:
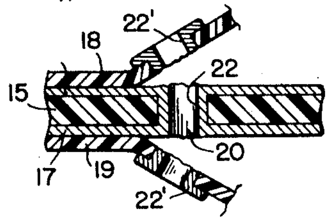

The coatings 18 and 19 are now stripped taking with them all excess of conductive layer 21 and unwanted plated copper on the outer surfaces of coating 18 and 19 while leaving intact the copper plating 22 lining the wall of the hole through insulation material 15 and adhering to the exposed edges of foils 16 and 17. FIG. 5 illustrates the stripping operation, the removed plating parts being designated by 22'.

After the stripping operation, the laminate may be briefly subjected to a repeated plating operation for the purpose of further re-enforcing the copper linings 22 and sealing pin holds around the periphery of each hole 20 that may have been caused by the stripping operation.

As is evident from the previous description, for the purpose of plating the wall of hole 20 it would be sufficient to cover the foil surfaces in the immediate vicinity of the holes only. However, as previously pointed out, coatings 18 and 19 also serve the purpose of protecting the foil surfaces from damage prior to the use of the laminate. It is therefore generally preferable to employ a laminate which is insulation coated in its entirety, the more so as a completed coated laminate is suitable for the conductive liquid by a dipping operation as described.

The laminate is now ready for developing the desired conductive pathway patterns from the foils by printed circuit techniques. The steps involved in these techniques generally require that the foil surfaces are completely free from grease, oxides, finger marks, etc. This can be conveniently achieved by scrubbing the foil surfaces with steel wool and a detergent which operation may also be employed to smooth the rim of sheath or joint 22 from which the superfluous sheath portions 22' are torn off.

A representation of the desired pathway patterns is now printed upon the surfaces of the exposed copper foils. The term "printing" as used herein should be understood in the broad sense in which it is now in general use in the printed circuit art, that is, the term "printing" is intended to include all methods of producing a design repsenting a conductive pathway pattern upon a surface, either by means of printing plate or directly by photomechanical means. Various methods suitable for the purpose are more fully described in prior United States Patents 2,441,960 and 2,587,568. The printing method subsequently described by way of illustration only, is to print a negative imprint of the pathway patterns with an ink which is capable of resisting both the chemical action of an electroplating bath and the electrode position proper. Registration of the imprints, made for instance by the silk screen method, with the holes can be attained by any means suitable for the purpose, for instance, pegs may be attached to the printing surface which are fitted into the holes 20.

Figure 7:
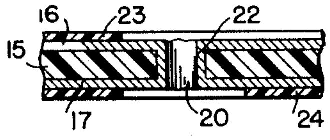
FIG. 7 is a section taken on line 7—7 of FIG. 6 on enlarged scale.
Figure 6:
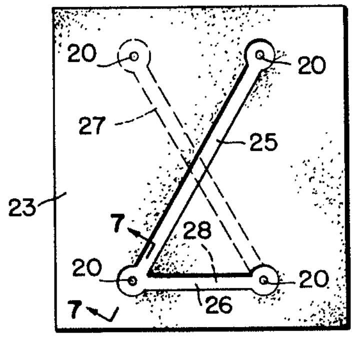
FIG. 6 is a plan view of the metal clad material of FIG. 1 showing several metallic joints in an intermediate stage and a step of forming conductive pathway patterns from the metal on both sides of the metal clad insulation material.

FIGS. 6 and 7 indicate the imprints as layers 23 and 24 respectively. In this connection, it may be mentioned that the pathway pattern shown in FIG. 6 and also in FIG. 10 has no specific significance. It merely illustrates that the exposed parts 25, 26 on one side and 27, 28 on the other side of the insulation material join the holes 20 and are connected by copper joint 22 through the holes in a continuous circuit.

All parts of the copper foil surfaces not covered by the resist ink are now plated with a metal other than the metal of the foils by means and methods suitable and well known for the purpose. As the foil metal is usually copper, a suitable dissimilar metal is for instance, 60% tin and 40% lead which is common soft solder. A plating with such an alloy will facilitate greatly a subsequent dip-soldering assembly operation by which the printed circuit product is connected to external circuit components which do not constitute part of the product. As is apparent, the just described plating operation also plates the copper sheath 22 with the dissimilar metal.

The choice of the dissimilar metal is governed to a certain extent by the use for which the printed circuit product is intended and also by the assembly method by which the circuit product is connected to external circuit components. To obtain high corrosion resistance, metal such as silver, gold, nickel or chromium can be plated upon the copper. In case silver plating is employed, the usual ferric chloride etch can be used as a mordant. If the printed circuit product is designed to coact with sliding contacts, rhodium may be used as plating metal.

Figure 8:
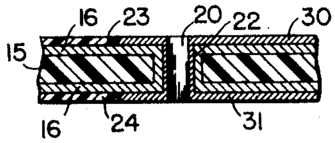
FIG. 8 and 9 are sections similar to FIG. 7 showing further steps of producing the two pathway patterns and the metallic joints therebetween.
Figure 9:
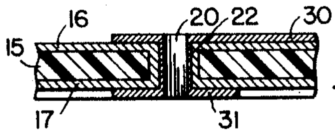
Figure 10:
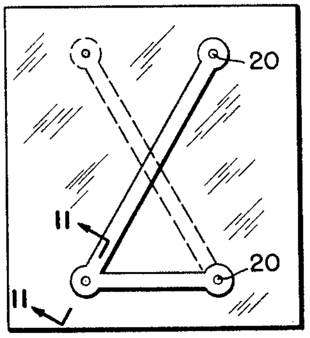
FIG. 10 is a plan view of the finished printed circuit product.

FIG. 8 shows that the plating 30 and 31 respectively covers the exposed portions of copper foils 16 and 17 and of sheath 22. In other words, the pathway patterns shown in FIGS. 6 and 10 are plated with metal dissimilar to the foil metal.

The next step is the removal of the layers 23 and 24 of the resist ink leaving a positive image of the pathway patterns adhered to the surfaces of the copper foils 16 and 17. A suitable solvent is used to remove the ink, together with a swabbing or brushing operation. The choice of the solvent depends, of course, upon the type of ink used. Many inks and solvents therefor are available on the market so that a detailed description of either the ink or the solvent is not necessary for the understanding of the invention.

Care need not be taken during the just described step to remove all traces of solvent-diluted ink which may accidentally penetrate into the plated holes although such traces should eventually be removed if dip-soldering is contemplated to secure leads of external circuit components within the plated holes 20.

Figure 11:
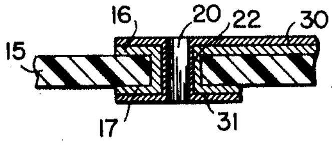
FIG. 11 is a section taken on line 11—11 of FIG. 10 on enlarged scale.
Figure 1:
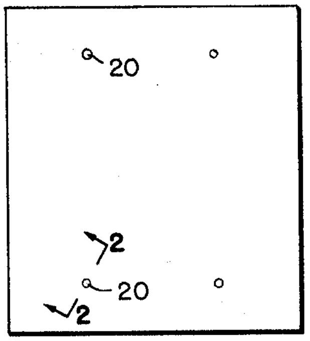
FIG. 1 is a plan view of holed two-sidedly metal clad insulation material or laminate suitable for use as stock material in the production of printed circuit products.

The final step is to remove all portions of the copper foils 16 and 17 which do not constitute parts of the conductive pathway patterns, or in other words, all copper material that is not covered by layers 30 and 31. For this purpose, the product is placed in an acid bath which will dissolve the exposed foil copper but not attack the dissimilar metal forming layers 30 and 31. When as previously described, layers 30 and 31 are formed by a lead-tin alloy a solution of sulphuric acid and chromic acid may be used. After all of the exposed and unwanted foil copper is etched away, copper will remain under the lead-tin alloy coating. FIGS. 10 and 11 show the printed circuit product after completion of the final step. The product is now ready for finishing and assembly operations.

As appears from the previous description, the steps of developing the pathway patterns from copper foils 16 and 17 and forming metallic joints interconnecting the two pathway patterns through the insulation board 15 are completely integrated so that some of the steps necessary to develop the pathway patterns are also steps necessary for producing the metallic joints and that when the last step of developing the pathway patterns is completed the metallic joints are also completed. This affords the advantage that the manufacture of the circuit product including all interconnections between the pathway pattern on opposite sides of backing can be carried out in a continuous operation.

Layers 16 and 17 need not to be foil adhered to insulation board 15 but insulation backed metal layers may be produced by any other suitable means such as electroplating. Finally, the method of interconnecting pathway patterns on opposite sides of an insulation board by plated holes the metal of which is metallically joined to the metal of the pathway patterns may be carried out after the pathway patterns have been developed from the foils or other metal layers. However, the described integrated operation of producing the pathway patterns and the metallic joints for interconnecting the same is generally preferred as it permits a more economical production of printed circuit products.

The holes may be formed and plated after the resist patterns are applied to the foils. But it is generally preferable to proceed in the order previously described. As pointed out before, the hole formation is a rather rough operation which is likely to damage the foil surfaces and also the resist patterns. Furthermore, the presence of coatings 18 and 19 permits the use of more vigorous electroplating processes for the plating-through-holes operation than are tolerated by the rather sensitive resist material.

While the invention has been described in detail with respect to a certain now preferred example and embodiment of the invention it will be understood by those skilled in the art after understanding the invention, that various changes and modifications may be made without departing from the spirit and scope of the invention, and it is intended, therefore, to cover all such changes and modifications in the appended claims.

What is claimed as new and desired to be secured by Letters Patent is:

1. In the method of manufacturing etched printed circuit products, the steps of providing two-sidedly metal clad insulation material covered on both sides with a first electrically non-conductive continuous coating, then forming a hole through said metal clad material and said coatings, then metal plating the wall surfaces defining said first hole, then removing said coatings together with plating material adhering to the outside of the first coatings while leaving intact the metal cladding and the plating within the hole, then producing on both metal layers a second coating in the form of a negative representation of a design representing a pathway pattern positioned to register with said plated hole, and finally removing by chemical action all parts of said metal layers other than those covered by the second coatings and constituting portions of the pathway patterns whereby pathway patterns are formed on both sides of the insulation material, electrically and mechanically joined through said plated hole.

2. In the method of manufacturing etched printed circuit products, the steps of providing two-sidedly metal clad insulation material covered on both sides with a firts electrically non-conductive continuous coating, then forming a hole through said metal clad material and said coatings, rendering conductive the wall surfaces defining said hole, then metal plating the wall surfaces defining said hole, then removing said first coatings together with plating material adhering to the outside of the first coatings while leaving intact the metal cladding and the plating within the hole, then printing with a resistant ink upon both metal layers a negative representation of a design representing a pathway pattern disposed to register with said plate hole, said resistant ink constituting second coatings, and finally removing by chemical action the parts of said metal layers other than those covered by the second coatings and constituting portions of the pathway patterns whereby pathway patterns are formed on both sides of the insulation material, electrically and mechanically joined through said plated hole.

3. In the method of manufacturing etched printed circuit products, the steps of providing two-sidedly metal clad insulation material covered on both sides with a first electrically non-conductive continuous coating, then forming a hole through said metal clad material and said first coatings, then metal plating the wall surfaces defining said hole, then removing said first coatings together with plating material adhering to the outside thereof while leaving intact the metal layers and the plating within the hole, printing upon both metal layers a negative representation of a desired pathway pattern with a resistant ink in coincidence with said plated hole, said ink constituting second coatings, then metal plating all exposed metal surfaces including the plating within the hole with a metal dissimilar to the metal of said metal layers and the plating of said hole, then removing the second coatings for exposing the non-plated parts of said metal layers, and finally subjecting the metal clad insulating material to chemical action in an etching bath attacking said exposed parts of the metal layers for removing the same whereby pathway patterns are formed on both sides of the insulation material, electrically and mechanically joined through said plated hole.

4. In a method of manufacturing etched printed circuit products the steps of providing two-sidedly, metal-clad insulation material covered on both sides with a protective, electrically non-conductive continuous coating, then forming a hole through said metal-clad insulation material and said coatings, then coating the wall surface defining said hole with a layer rendering said wall surface electrically conductive, then metal plating said wall surface by electrodeposition, and thereupon removing said protective coatings together with plating material adhering to the outside thereof while leaving intact the metal cladding and the plating within the hole whereby the metal layers on both sides of the insulation material are metallically joined by said plating through the insulation material.

5. The method according to claim 4 wherein said conductive layer within the hole is formed by applying a conductive liquid hardening to a conductive film upon said wall surface defining the hole.

6. The method according to claim 5 wherein said conductive liquid is applied to said wall surface by subjecting said metal-clad insulation material to a dipping operation.

7. The method according to claim 4 wherein said conductive layer is formed by chemical deposition of a metal film upon the wall surface defining said hole.

8. The method according to claim 4 wherein said conductive layer is formed by first applying a conductive liquid hardening to a conductive film on said wall surface to coat the same with a preliminary coating and subsequently depositing a metal film on said coating by chemical deposition.

9. The method according to claim 4 wherein at the beginning of the plating step a current higher than the normal plating current is applied to produce flash coating on said wall surface.

10. The method according to claim 4 and further comprising the step of subjecting the metal layers and the plating in the hole to a further metal plating operation, after removal of said protective coatings.

11. The method according to claim 10 wherein the metal layers on both sides of the insulation material and the plating in the hole were metal-plated with a metal dissimilar to the metal of the layers and in the hole.

12. A method of forming an aperture with a metallic lining in an insulating base, said insulating base having an electrical conductor on at least one side thereof, said method comprising the steps of coating both sides of the base with a layer of non-conductive strippable material, forming an aperture in said coated base such that it passes through said electrical conductor, forming on at least one side of said coated base and on the inner surface of said aperture a continuous layer of conductive material, coating said conductive material with a layer of metal by electroplating, and removing said layers of strippable material from both sides of the base along with portions of said layer of conductive material and said layer of metal overlying said layer of non-conductive strippable material.

References Cited by the Examiner

UNITED STATES PATENTS

| | | | |
|---|---|---|---|
| 2,474,988 | 7/49 | Sargrove | 29—155.5 |
| 2,593,479 | 4/52 | Nieter | 339—17 |
| 2,599,710 | 6/52 | Hathaway | 29—155.5 |
| 2,603,681 | 7/52 | Salisbury | 339—17 |
| 2,616,994 | 11/52 | Luhn | 29—155.5 X |
| 2,699,424 | 1/55 | Nieter | 29—155.5 X |
| 2,699,425 | 1/55 | Nieter | 339—17 |
| 2,897,409 | 7/59 | Gitto | 204—15 |

OTHER REFERENCES

Electronic Design, Printed Circuit Design, Maisch, pp. 16–19, September 1954.

JOHN H. MACK, *Primary Examiner.*

JOSEPH C. MANIAN, WHITMORE A. WILTZ, JOHN R. SPECK, JOSEPH REBOLD, *Examiners.*